US008184333B2

(12) United States Patent
Sugita et al.

(10) Patent No.: US 8,184,333 B2
(45) Date of Patent: May 22, 2012

(54) IMAGE RECORDING PROCESSING CIRCUIT, IMAGE RECORDING APPARATUS AND IMAGE RECORDING METHOD USING IMAGE RECORDING PROCESSING CIRCUIT

(75) Inventors: Yukio Sugita, Odawara (JP); Yoji Okazaki, Odawara (JP); Takao Ozaki, Odawara (JP)

(73) Assignee: FUJIFILM Corporation, Tokyo (JP)

( * ) Notice: Subject to any disclaimer, the term of this patent is extended or adjusted under 35 U.S.C. 154(b) by 1209 days.

(21) Appl. No.: 11/912,796

(22) PCT Filed: Apr. 28, 2006

(86) PCT No.: PCT/JP2006/309348
§ 371 (c)(1),
(2), (4) Date: Oct. 26, 2007

(87) PCT Pub. No.: WO2006/118340
PCT Pub. Date: Nov. 9, 2006

(65) Prior Publication Data
US 2009/0074401 A1 Mar. 19, 2009

(30) Foreign Application Priority Data

Apr. 28, 2005 (JP) ................ 2005-132030
Apr. 28, 2005 (JP) ................ 2005-132038

(51) Int. Cl.
*G06F 15/00* (2006.01)
*G06F 15/16* (2006.01)
*B41J 2/435* (2006.01)

(52) U.S. Cl. ............ 358/1.6; 709/202; 347/224
(58) Field of Classification Search .............. None
See application file for complete search history.

(56) References Cited

U.S. PATENT DOCUMENTS

| 5,485,212 A | * | 1/1996 | Frederick ............ 375/240.12 |
| 6,300,963 B1 | | 10/2001 | Urbanus et al. |
| 7,336,391 B2 | | 2/2008 | Okuyama |
| 2001/0033322 A1 | * | 10/2001 | Bommersbach et al. ..... 347/232 |
| 2003/0031365 A1 | | 2/2003 | Okuyama |
| 2004/0252315 A1 | | 12/2004 | Kang |
| 2005/0052464 A1 | | 3/2005 | Okuyama |

FOREIGN PATENT DOCUMENTS

| JP | 08-051586 A | 2/1996 |
| JP | 2002-372790 A | 12/2002 |
| JP | 2003-015309 A | 1/2003 |
| JP | 2003050469 A | 2/2003 |

OTHER PUBLICATIONS

Rejection of the Application, dated Jan. 31, 2012, issued in related JP Application No. 2006-126463, 4 pages in English and Japanese.

* cited by examiner

*Primary Examiner* — Chan S Park
*Assistant Examiner* — Mesfin Getaneh
(74) *Attorney, Agent, or Firm* — Sughrue Mion, PLLC

(57) ABSTRACT

Mirror sequential data supplied from an RIP are temporarily stored as divided data in memory banks of an intermediate memory. Thereafter, the stored mirror sequential data are read in blocks. Then, a transposition processor transposes a matrix of the mirror sequential data into frame sequential data, and supplies the frame sequential data to a DMD controller.

20 Claims, 10 Drawing Sheets

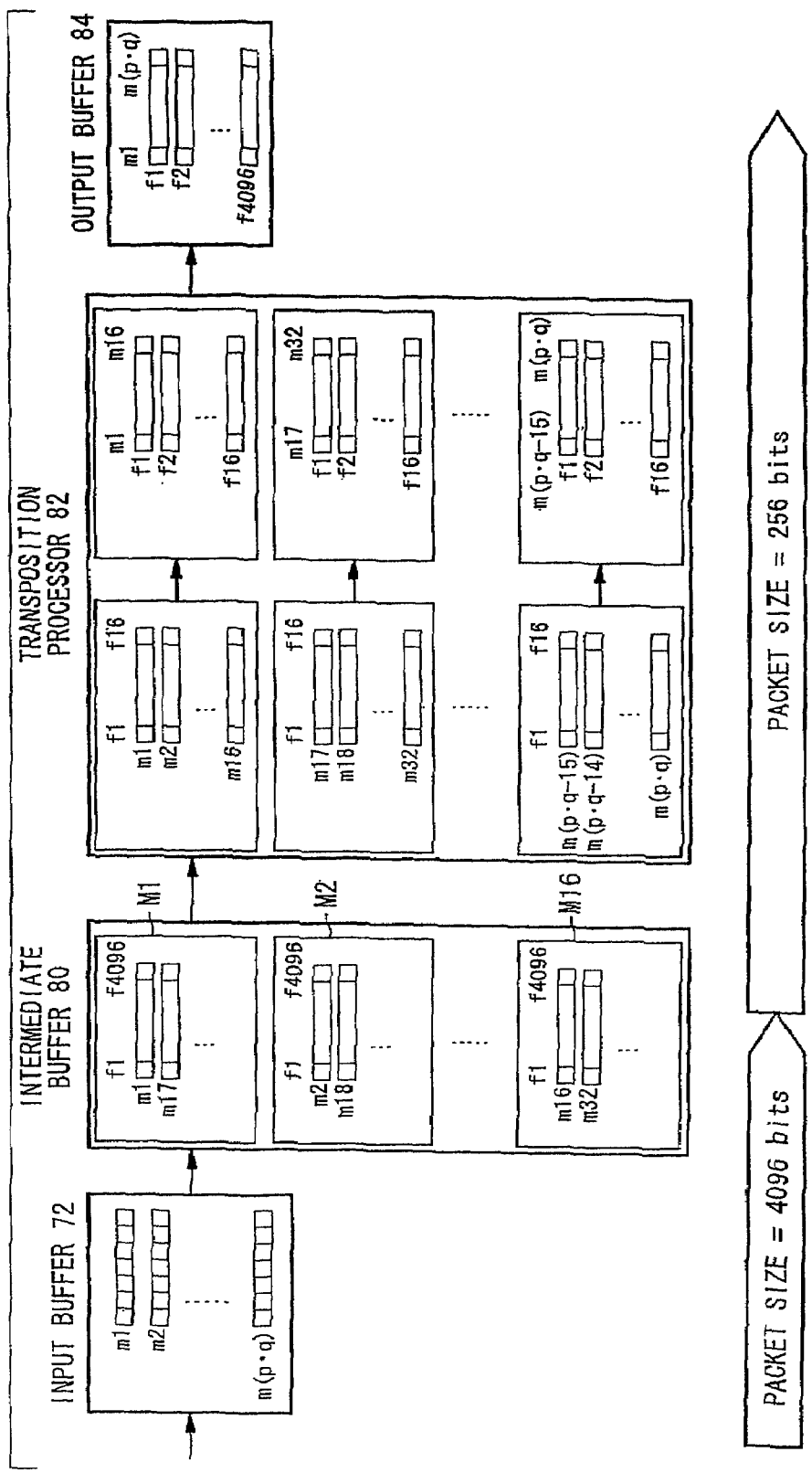

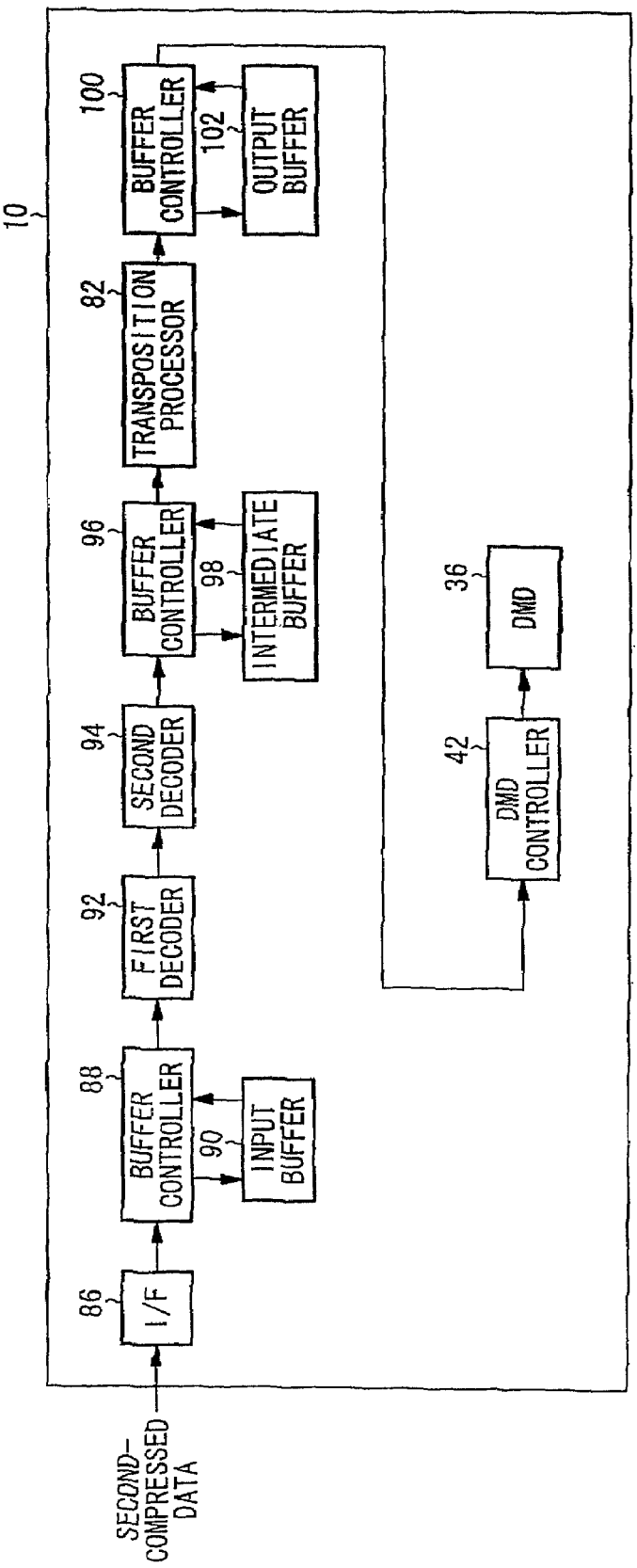

IMAGE RECORDING PROCESSING CIRCUIT, IMAGE RECORDING APPARATUS AND IMAGE RECORDING METHOD USING IMAGE RECORDING PROCESSING CIRCUIT

CROSS REFERENCE TO RELATED APPLICATIONS

This application is a National Stage of International Application No. PCT/JP2006/309348 filed on Apr. 28, 2006, claiming priority based on Japanese Patent Application No. 2005-132030, filed Apr. 28, 2005 and Japanese Patent Application No. 2005-132038, filed Apr. 28, 2005, the contents of all of which are incorporated herein by reference in their entirety.

TECHNICAL FIELD

The present invention relates to an image recording processing circuit incorporated in an image recording apparatus for moving image recording heads relatively to an image recording surface, the image recording heads each having a plurality of image recording components for forming, on the image recording surface, an image recording dot group comprising a plurality of image recording dots, and successively supplying the image recording components with a plurality of image recording dot data for forming the image recording dot group depending on the relative movement of the image recording heads to form a chronological sequence of image recording dot groups for thereby recording a two-dimensional image on the image recording surface, and an image recording apparatus and an image recording method which use such an image recording processing circuit.

BACKGROUND ART

Heretofore, there have been known various image recording apparatus for forming a desired two-dimensional image on an image recording surface based on image data.

There have been proposed, as an example of image recording apparatus, exposure apparatus which employ a spatial light modulator such as a digital micromirror device (DMD) or the like for exposing a film to an image represented by a light beam that is modulated by image data. The DMD comprises a number of micromirrors disposed in a two-dimensional array in memory cells (SRAM array) on a semiconductor substrate of silicon or the like. The micromirrors have respective reflecting surfaces whose angles are changed when the micromirrors are tilted by controlling electrostatic forces due to electric charges stored in the memory cells. When the angles of the reflecting surfaces are changed, image recording dots are formed at desired positions to form an image.

An exposure apparatus employing a DMD has been proposed. The exposure apparatus forms a desired two-dimensional image on an exposure surface by moving the DMD in a predetermined direction relatively to the exposure surface and supplying image recording dot data to the memory cells of the DMD to form a chronological sequence of successive image recording dot groups with a micromirror group of the DMD (see Japanese Laid-Open Patent Publication No. 2003-50469 for details).

The micromirror group of the DMD comprises an array of micromirrors arranged in rows and columns which extend perpendicularly to each other. The DMD that is inclined to the scanning direction is effective to reduce the intervals between scanning lines for increased resolution.

Image data are usually supplied to the exposure apparatus while they are arrayed in a sequence along the direction in which the micromirrors of the DMD move relatively to the exposure surface. If the image data are read and supplied to the memory cells of the DMD in the same sequence, then since it is time-consuming to read the image data, a desired two-dimensional image cannot efficiently be recorded on the exposure surface.

For recording a two-dimensional image on the above exposure apparatus, therefore, it is necessary to convert image data representing the two-dimensional image into frame data depending on the array of the micromirrors of the DMD and then supply the frame data to the DMD.

However, it is highly burdensome for the exposure apparatus to convert image data at a time into frame data that are to be supplied to the many memory cells of the DMD.

Furthermore, image data are supplied from an external processing apparatus which is independent of the exposure apparatus. Unless the external processing apparatus and the exposure apparatus have the same data processing rate, the data processing rate of one of the apparatus tends to limit the data processing rate of the other apparatus. While efforts may be made to equalize the data processing rates of the external processing apparatus and the exposure apparatus, they make one of the apparatus suffer from a specification overkill and hence an increase in the cost.

DISCLOSURE OF INVENTION

It is a general object of the present invention to provide an image recording processing circuit which is capable of easily and quickly generating frame sequential data as a chronological sequence of data for each image recording component group formed by an image recording head for efficiently recording a two-dimensional image, and an image recording apparatus and an image recording method which use such an image recording processing circuit.

Another object of the present invention is to provide an image recording processing circuit which is capable of increasing flexibility of system design and of easily generating frame data for image recording, and an image recording apparatus and an image recording method which use such an image recording processing circuit.

The above and other objects, features, and advantages of the present invention will become more apparent from the following description when taken in conjunction with the accompanying drawings in which preferred embodiments of the present invention are shown by way of illustrative example.

BRIEF DESCRIPTION OF DRAWINGS

FIG. 9 is a diagram showing a data processing process performed by the exposure recording apparatus; and FIG. 10 is a block diagram of a control circuit of the exposure recording apparatus according to another embodiment of the present invention.

BEST MODE FOR CARRYING OUT THE INVENTION

Figure 1:
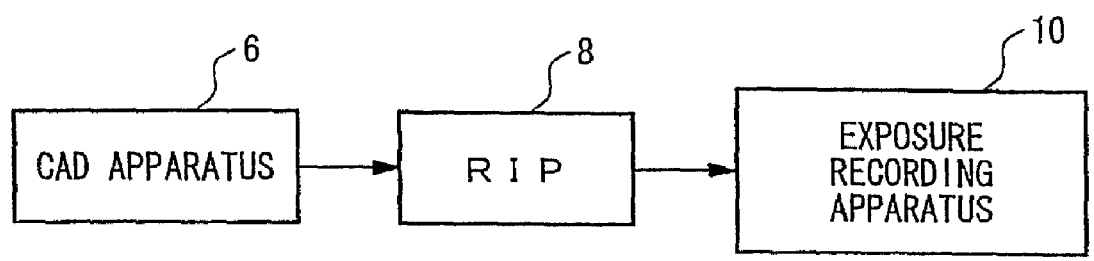
FIG. 1 is a block diagram of an exposure recording system according to an embodiment of the present invention.

FIG. 1 shows in block form an exposure recording system according to an embodiment of the present invention which incorporates an image recording processing circuit according to the present invention and an image recording apparatus and an image recording method which use such an image recording processing circuit.

As shown in FIG. 1, the exposure recording system basically has a Computer-Aided Design (CAD) apparatus 6 for generating image data and outputting the generated image data as vector data, a raster image processor (RIP) 8 for converting the vector data sent from the CAD apparatus 6 into bitmap data, compressing the bitmap data into run-length data, and outputting the run-length data, and an exposure recording apparatus 10 for expanding the run-length data sent from the RIP 8 into bitmap data, converting the bitmap data into image recording data made of an image recording dot group, and recording a two-dimensional image on an image recording surface based on the image recording data.

The exposure recording apparatus 10 is an apparatus for exposing a laminated printed-wiring board or the like based on image data. The exposure recording apparatus 10 is constructed as shown in FIG. 2.

Figure 2:
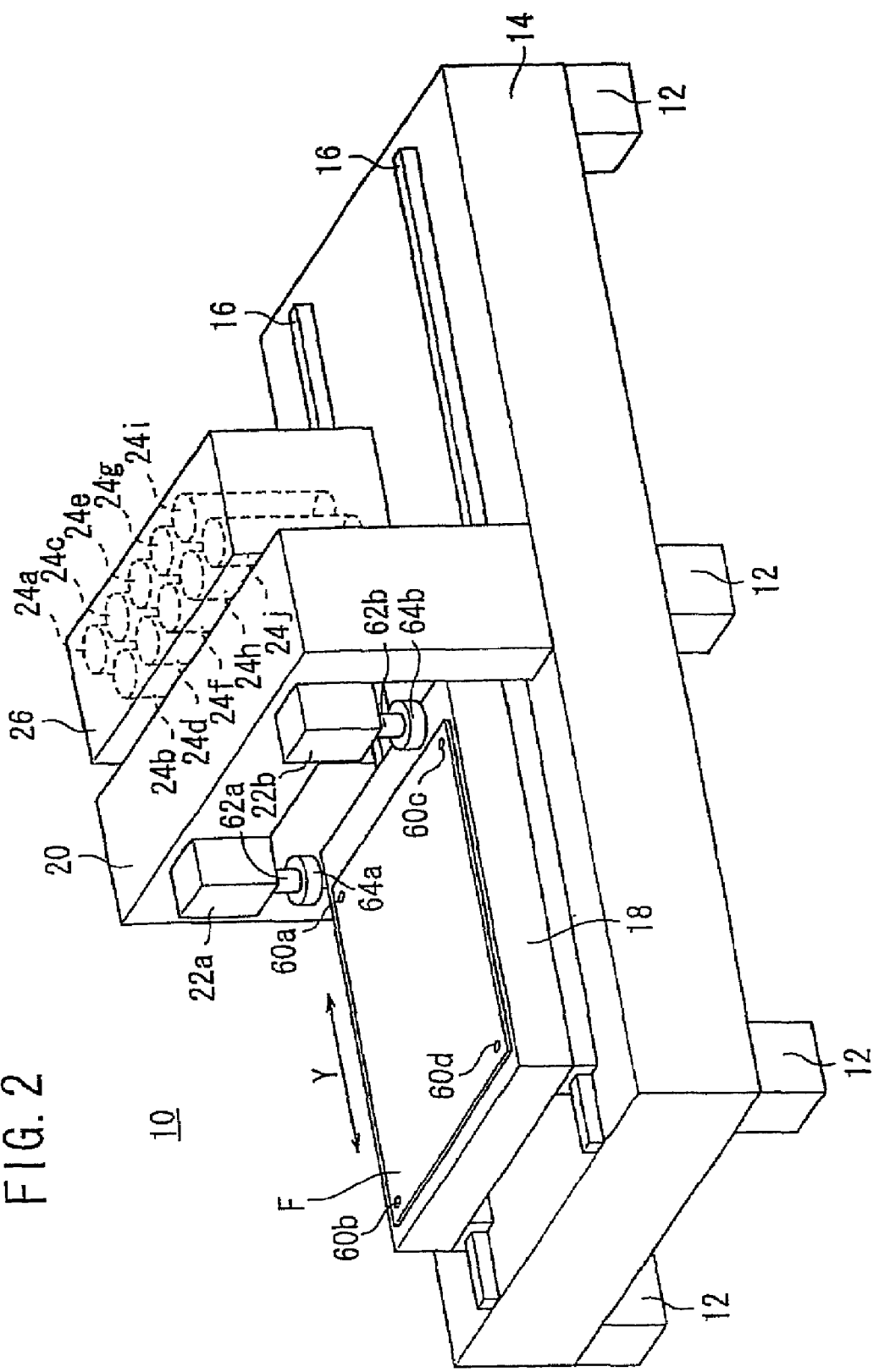
FIG. 2 is a perspective view of an exposure recording apparatus of the exposure recording system according to the embodiment.

As shown in FIG. 2, the exposure recording apparatus 10 has a base 14 supported by a plurality of legs 12 and an exposure stage 18 is provided on two guide rails 16 mounted on the base 14 for reciprocal movement therealong in the directions indicated by the arrow Y. The base 14 is of high dimensional accuracy with extremely small deformations. A rectangular substrate F coated with a photosensitive material is attracted to and held by the exposure stage 18.

A portal-shaped column 20 is disposed centrally on the base 14 over the guide rails 16. CCD cameras 22a, 22b are fixedly mounted on one side of the column 20 for detecting alignment marks 60a through 60d disposed at respective positions on the substrate F. A plurality of exposure heads 24a through 24j (image recording heads) for recording an image on the substrate F through exposure are positioned in and held by a scanner 26 that is fixedly mounted on the other side of the column 20. Flash lamps 64a, 64b are mounted on the CCD cameras 22a, 22b, respectively, by respective rod lenses 62a, 62b. The flash lamps 64a, 64b apply an infrared radiation to which the substrate F is insensitive, as illuminating light, to an image capturing area for the CCD cameras 22a, 22b.

The alignment marks 60a through 60d comprise through holes or recorded marks or patterns that can clearly be distinguished from the substrate F on which an image is to be recorded. The alignment marks 60a through 60d are disposed closely to the respective corners of the substrate F that is fed by the exposure stage 18. However, the alignment marks 60a through 60d may be positioned in other locations than the corners on the substrate F insofar as those locations do not adversely affect an image recorded on the substrate F.

Figure 3:
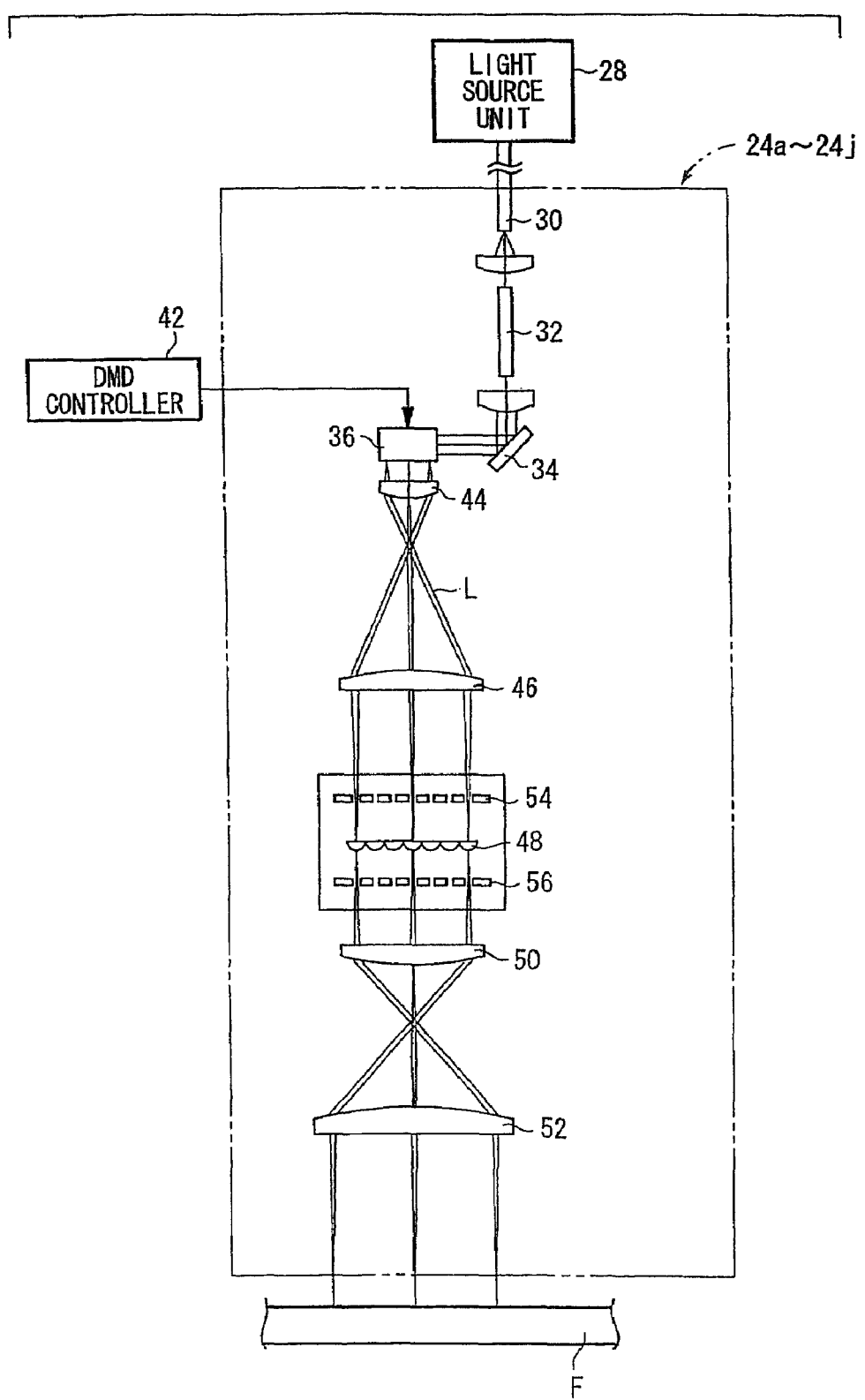
FIG. 3 is a schematic view of an exposure head of the exposure recording apparatus.

The exposure heads 24a through 24j are arranged in a staggered pattern in two rows extending in a direction perpendicular to the direction in which the substrate F moves, i.e., the direction indicated by the arrow Y. FIG. 3 shows a structure of each of the exposure heads 24a through 24j. For example, a combined laser beam L emitted from a plurality of semiconductor lasers of a light source unit 28 is introduced through an optical fiber 30 into each of the exposure heads 24a through 24j. A rod lens 32, a reflecting mirror 34, and a digital micromirror device (DMD) 36 are successively arranged on an exit end of the optical fiber 30 into which the laser beam L is introduced.

Figure 4:
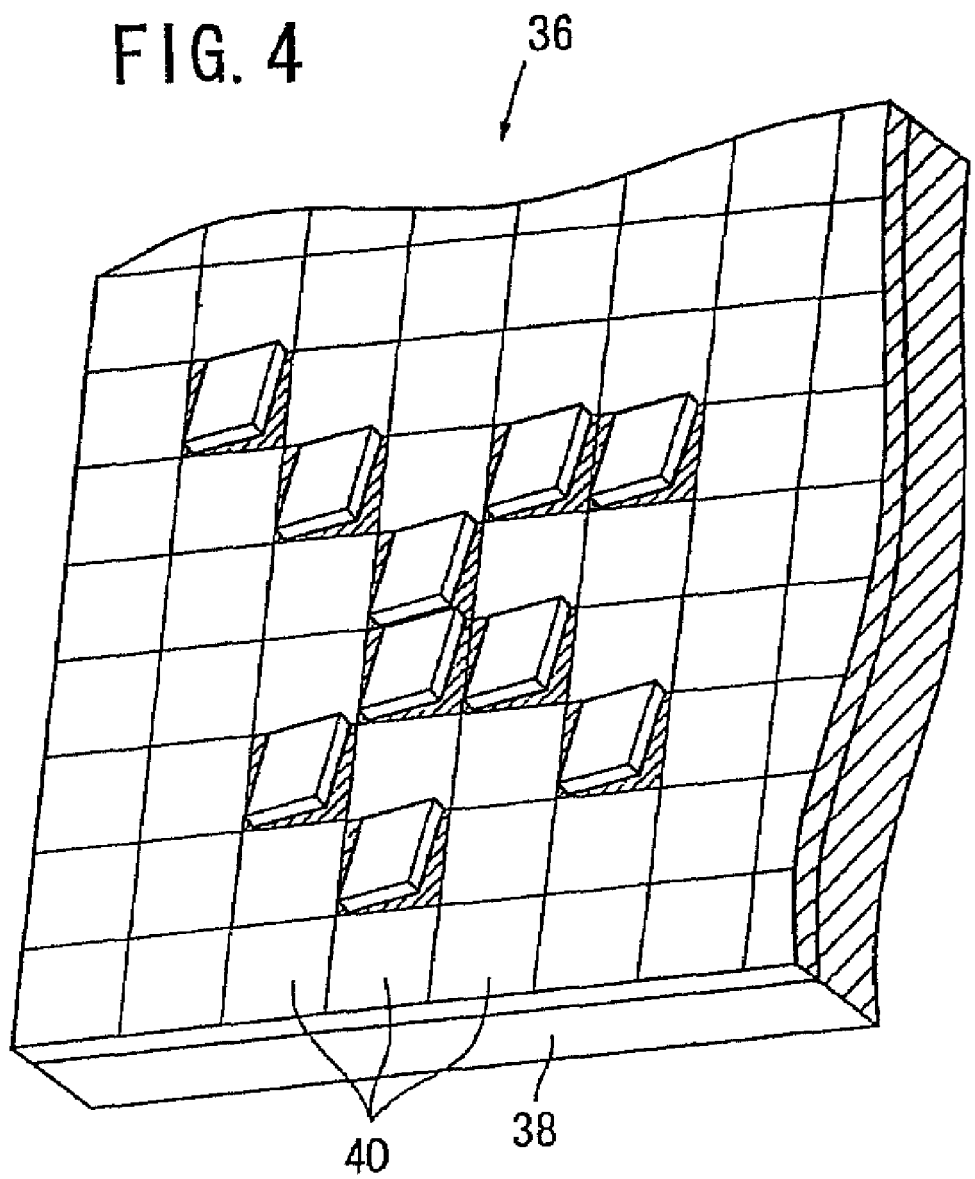
FIG. 4 is an enlarged fragmentary view showing a digital micromirror device (DMD) employed in the exposure head of the exposure recording apparatus.

As shown in FIG. 4, the DMD 36 comprises a number of micromirrors 40 that are swingably disposed in a grid-like pattern on an SRAM cell (memory cell) 38. A material having a high reflectance such as aluminum or the like is evaporated on the surface of each of the micromirrors 40. When a digital signal according to image recording data is written in the SRAM cell 38 by a DMD controller (DMD control unit) 42 (see FIG. 3), the micromirrors 40 are tilted in given directions depending on the applied digital signal. Depending on how the micromirrors 40 are tilted, the laser beam L is turned on or off.

In the direction in which the laser beam L is reflected by the DMD 36 that is controlled to be turned on or off, there are successively disposed first image focusing optical lenses 44, 46 of a magnifying optical system, a microlens array 48 having many lenses corresponding to the respective micromirrors 40 of the DMD 36, and second image focusing optical lenses 50, 52 of a zooming optical system. Microaperture arrays 54, 56 for removing stray light and adjusting the laser beam L to a predetermined diameter are disposed in front of and behind the microlens array 48.

Figure 5:
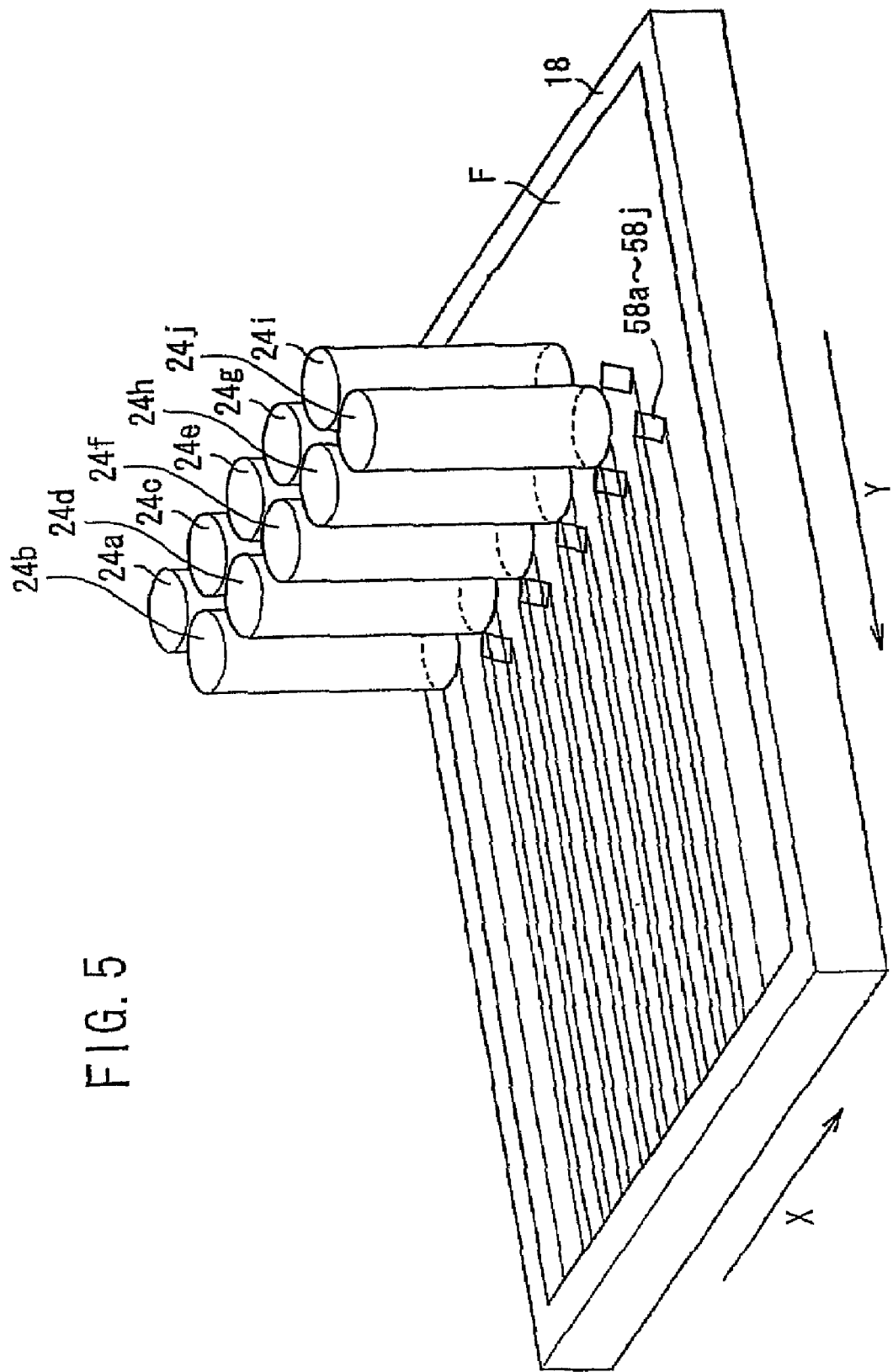
FIG. 5 is a view showing the relationship between the exposure head of the exposure recording apparatus and a substrate positioned on an exposure stage.
Figure 6:
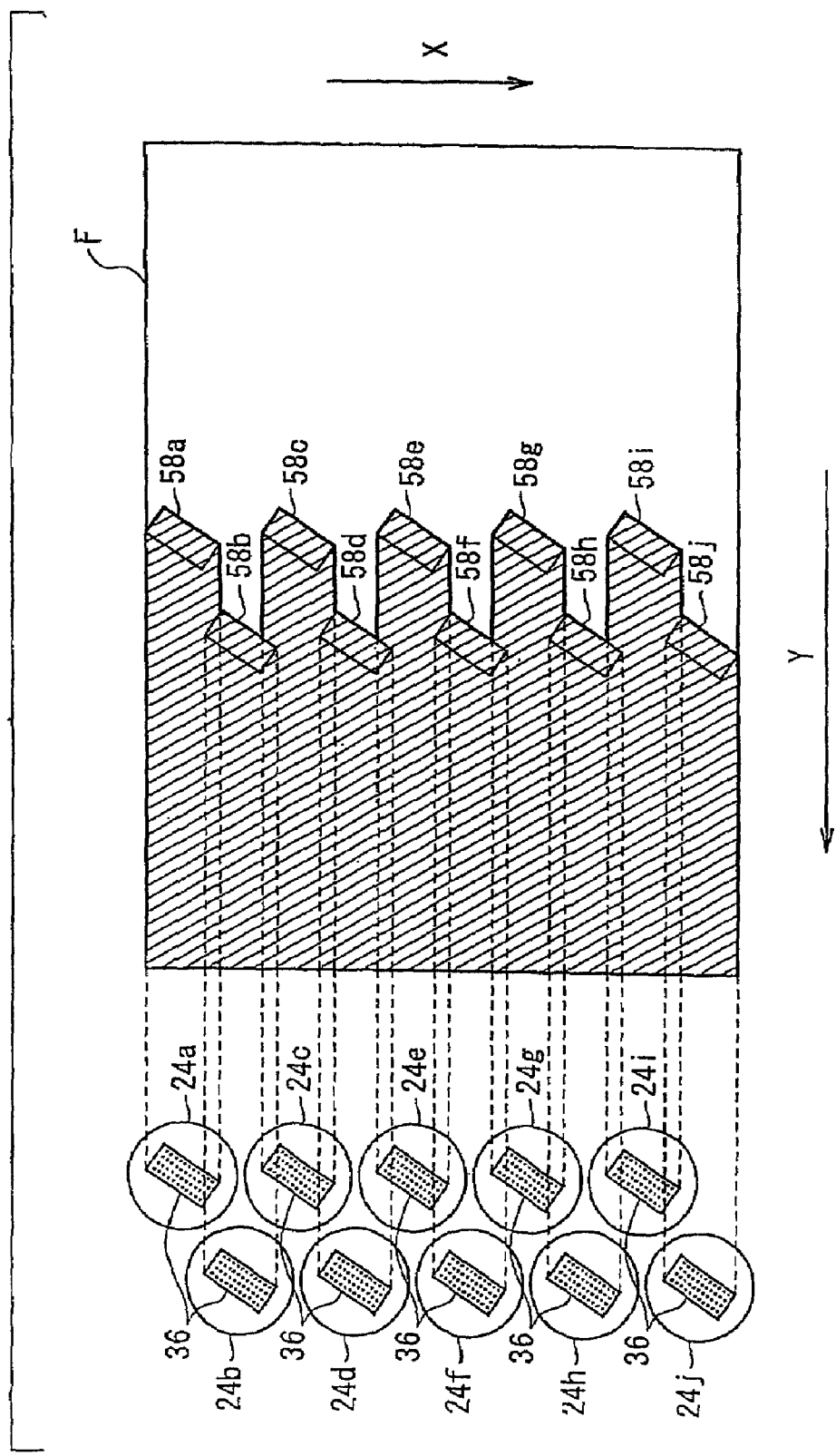
FIG. 6 is a view showing the relationship between the exposure head of the exposure recording apparatus and an exposure area on the substrate.

As shown in FIGS. 5 and 6, the DMDs 36 incorporated in the respective exposure heads 24a through 24j are inclined a predetermined angle to the direction in which the substrate F moves, i.e., the direction indicated by the arrow Y, for achieving higher resolution. Specifically, the DMDs 36 that are inclined to the direction in which the substrate P moves reduce the interval between the micromirrors 40 of the DMDs 36 in the direction, i.e., the direction indicated by the arrow X, perpendicular to the direction indicated by the arrow Y, thereby increasing the resolution in the direction indicated by the arrow X. The resolution in the direction indicated by the arrow Y can be adjusted by the speed at which the substrate F moves. To make the exposure heads 24a through 24j seamless, they are arranged such that exposure areas 58a through 58j which are exposed at a time by the respective exposure heads 24a through 24j overlap in the direction indicated by arrow X.

Figure 7:
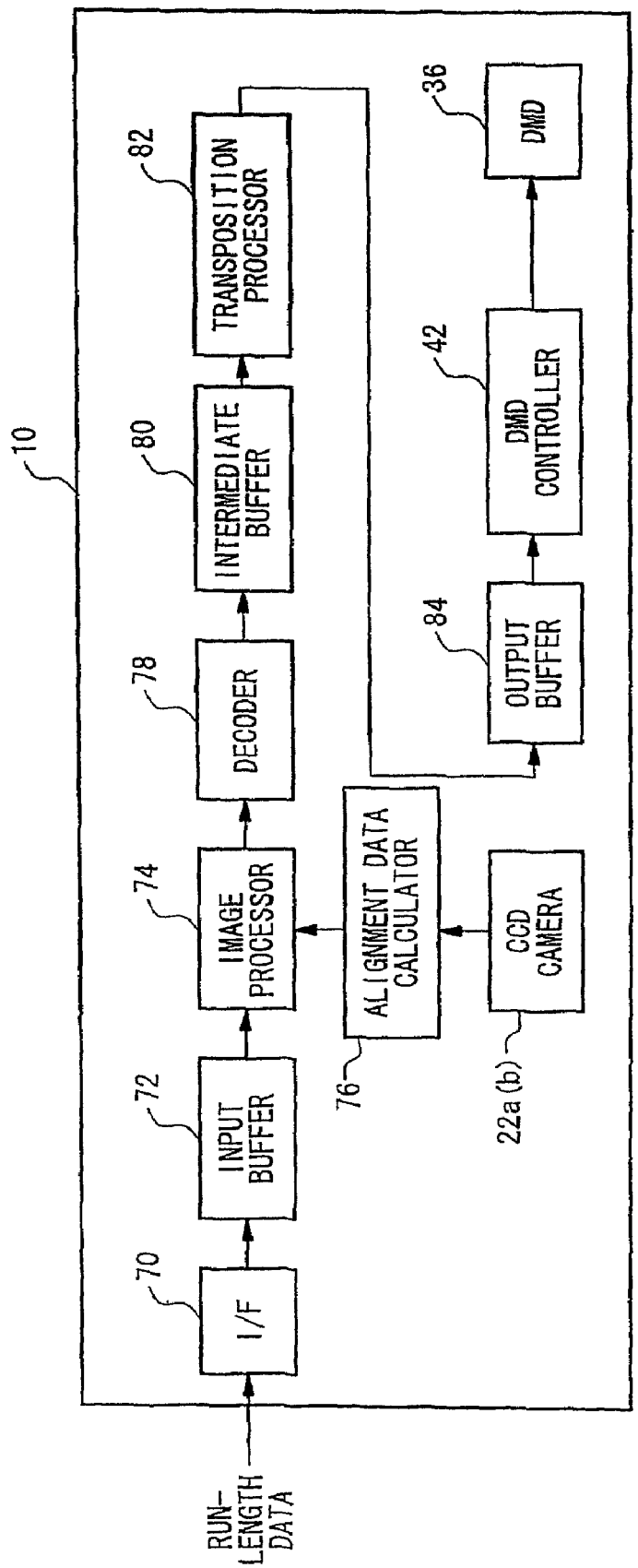
FIG. 7 is a block diagram of a control circuit of the exposure recording apparatus.

FIG. 7 shows in block form a control circuit of the exposure recording apparatus 10. The exposure recording apparatus 10 has an interface (I/F) 70 for receiving run-length data sent as image data from the RIP 8, an input buffer 72 for temporarily storing the run-length data received by the I/F 70, and an image processor 74 for performing an image processing process including an alignment process on the run-length data read from the input buffer 72.

An alignment data calculator 76 is connected to the image processor 74. The alignment data calculator 76 calculates alignment data for adjusting a positional deviation of the substrate F with respect to the exposure stage 18, a deformation of the substrate F, etc., based on the alignment marks 60a through 60d that are read by the CCD cameras 22a, 22b, and supplies the calculated alignment data to the image processor 74.

The exposure recording apparatus 10 also has a decoder 78 for expanding run-length data that have been aligned by the image processor 74 into bitmap data, an intermediate buffer 80 (image recording component sequential data storage circuit) for temporarily storing the expanded bitmap data, a transposition processor (converting circuit) 82 for reading blocks of the bitmap data stored in the intermediate buffer 80, each block comprising a predetermined amount of data, and converting each of the blocks of the bitmap data into frame data for the exposure heads 24a through 24j, and an output buffer 84 (frame sequential data storage circuit) for temporarily storing the converted frame data. The frame data stored by the output buffer 84 are supplied as image recording data to a DMD controller 42 (image recording component control circuit). Based on the supplied image recording data, the DMD controller 42 actuates the DMD 36 to record a desired two-dimensional image on the substrate F by way of exposure.

The exposure recording apparatus 10 according to the embodiment of the present invention is basically constructed as described above. Operation of the exposure recording apparatus 10 will now be described below.

First, the CAD apparatus 6 generates image data of a two-dimensional image to be recorded on the substrate F. The CAD apparatus 6 sends the image data as vector data to the RIP 8. The RIP 8 converts the supplied vector data into bitmap data as raster image data.

Figure 8:
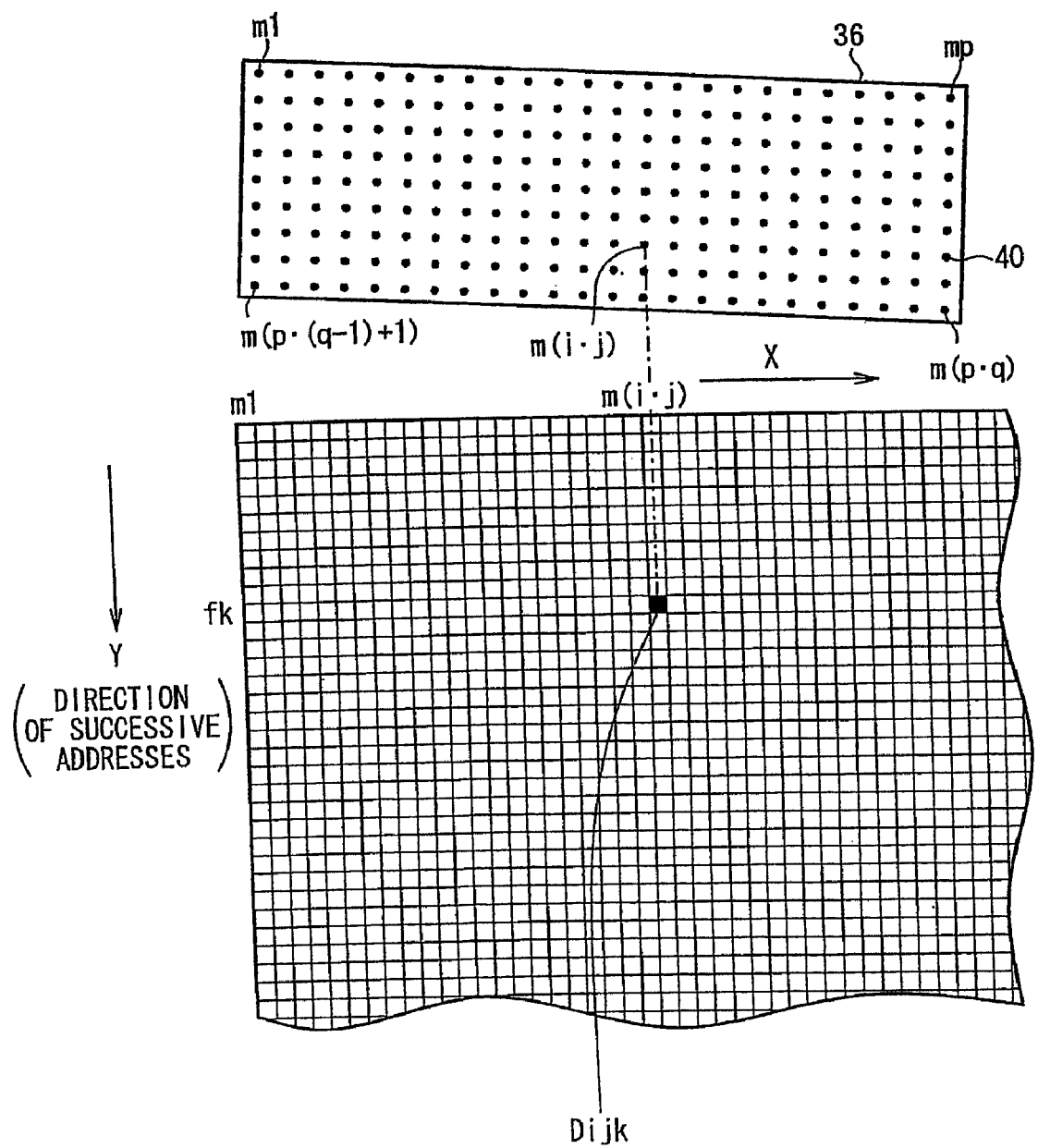
FIG. 8 is a view showing the relationship between the micromirrors of the DMD and mirror sequential data.

As schematically shown in FIG. 8, the bitmap data generated by the RIP 8 comprise image recording dot data Dijk to be reproduced on the substrate F by the respective micromirrors 40 of the DMD 36. The image recording dot data Dijk are addressable by successive addresses along the direction in which the substrate F moves, i.e., the direction indicated by the arrow Y. Since the image recording dot data Dijk are established for the respective micromirrors 40, the image recording dot data Dijk are referred to as "mirror sequential data". The image recording dot data Dijk refer to image recording data of a frame fk for a micromirror m(i·j) among the micromirrors 40 arranged in p columns and q rows. The term "frame" signifies a set of image recording dot data supplied to the micromirrors 40 of one DMD 36.

The RIP 8 compresses the mirror sequential data into run-length data for each of the micromirrors 40, and sends the run-length data to the exposure recording apparatus 10.

FIG. 9 shows a data processing process performed by the exposure recording apparatus 10. The data processing process performed by the exposure recording apparatus 10 will be described below with reference to FIG. 9.

Mirror sequential data sent as run-length data from the RIP 8 are stored as respective data for micromirrors m1, m2, . . . , m(p·q) into the input buffer 72 through the I/F 70.

After the substrate F is attracted to and held by the exposure stage 18, the exposure stage 18 is moved to the scanner 26. Then, the alignment marks 60a through 60d on the substrate F are read by the CCD cameras 22a, 22b. Based on the positional data of the alignment marks 60a through 60d that have been read by the CCD cameras 22a, 22b, the alignment data calculator 76 calculates alignment data for adjusting a positional deviation of the substrate F with respect to the exposure stage 18, a deformation of the substrate F, etc.

The image processor 74 reads the run-length data from the input buffer 72, aligns the run-length data according to the alignment data calculated by the alignment data calculator 76, and supplies the aligned run-length data to the decoder 78.

The decoder 78 expands the aligned run-length data for the respective micromirrors m1, m2, . . . , m(p·q) into bitmap data, and stores the bitmap data into the intermediate buffer 80. Specifically, the bitmap data are transferred as data packets each having a packet size of 4096 bits to the intermediate buffer 80, and stored in the intermediate buffer 80. The packet size may be set to a value depending on the data transfer rate of the RIP 8. The intermediate buffer 80 is divided into 16 memory banks M1 through M16 (storage areas). Mirror sequential data for the micromirrors m1, m17, . . . are assigned to and stored in the memory bank M1. Mirror sequential data for the micromirrors m2, m18, . . . are assigned to and stored in the memory bank M2. Mirror sequential data for the micromirrors m16, m32, . . . are assigned to and stored in the memory bank M16.

The transposition processor 82 reads blocks, each having a predetermined packet size, of the mirror sequential data as the bitmap data from the intermediate buffer 80. At this time, the transposition processor 82 can establish a packet size for each of the blocks independently of the packet size for the data transferred from the RIP 8, and read the mirror sequential data in the established packet size. Therefore, the exposure recording apparatus 10 does not need to have the same processing capability as the RIP 8, and can be designed more freely with increased latitude. Since the mirror sequential data are assigned to and stored in the 16 memory banks M1 through M16 of the intermediate buffer 80, the mirror sequential data for the micromirrors m1 through m16 can simultaneously be read from the memory banks M1 through M16.

The transposition processor 82 converts the mirror sequential data read in blocks into data for frames that are arranged in the direction of successive addresses for the micromirrors 40 of the DMD 36. Specifically, the transposition processor 82 performs the transposition of a matrix of the mirror sequential data to convert blocks of the mirror sequential data into data for frames (hereinafter referred to as "frame sequential data") that are arranged in the direction of successive addresses for the micromirrors 40 of the DMD 36. At this time, the transposition processor 82 does not convert the mirror sequential data for all the micromirrors 40 of the DMD 36 at a time into frame sequential data, but converts each of blocks of the mirror sequential data at a time into frame sequential data. Therefore, the burden posed on the transposition processor 82 for data conversion is sufficiently reduced.

The transposition processor 82 sends a predetermined number of frames of the converted frame sequential data at a time to the output buffer 84, which stores the supplied frames of the frame sequential data.

When the frame sequential data are stored in the output buffer 84, the exposure recording apparatus 10 moves the exposure stage 18 from the scanner 26 to the CCD cameras 22a, 22b, and controls the scanner 26 to start recording a desired image on the substrate F by way of exposure.

The laser beam L emitted from the light source unit 28 is introduced through the optical fiber 30 into the exposure heads 24a through 24j. In each of the exposure heads 24a through 24j, the introduced laser beam L travels through the rod lens 32 and is reflected by the reflecting mirror 34 into the DMD 36.

The DMD controller 42 reads frames of the frame sequential data from the output buffer 84, and selectively turns on and off the micromirrors 40 of the DMD 36 based on the frame sequential data. The laser beam L applied to the DMD 36 is selectively reflected by the micromirrors 40 of the DMD 36. The laser beam L that is selectively reflected in a desired direction by each of the micromirrors 40 of the DMD 36 is magnified by the first image focusing optical lenses 44, 46, adjusted to a predetermined spot diameter by the microaperture array 54, the microlens array 48, and the microaperture array 56, then adjusted to a predetermined magnification by the second image focusing optical lenses 50, 52 which serve as an optical magnification changer, and led to the substrate F. The exposure stage 18 moves along the base 14, during which time a desired two-dimensional image is recorded on the substrate F by the exposure heads 24a through 24j that are arrayed in the direction perpendicular to the direction in which the exposure stage 18 moves. The desired two-dimensional image is recorded in a target position on the substrate F which is defined according to the alignment marks 60a through 60d.

In the exposure recording apparatus 10 described above, blocks of the mirror sequential data supplied from the input buffer 72 are temporarily stored in the memory banks M1 through M16 of the intermediate buffer 80, then read from the memory banks M1 through M16, and thereafter transposed. However, the intermediate buffer 80 may be dispensed with, and the mirror sequential data may be directly read from the input buffer 72 and then transposed.

Specifically, only a certain number of frames of the mirror sequential data for all the micromirrors 40 of the DMD 36 may be extracted and transferred to the transposition processor 82, and then may be transposed into frame sequential data by the transposition processor 82.

In the embodiment described above, the exposure recording apparatus 10 processes bitmap data as binary data, and supplies frame sequential data representative of on and off states to the DMD 36. However, the present invention may be applied to apparatus and processes for processing image data as multi-valued data in the same manner described above.

Further, in the embodiment described above, the image processor 74 of the exposure recording apparatus 10 performs an image processing process including an alignment process on the run-length data read from the input buffer 72, and then the decoder 78 of the exposure recording apparatus 10 converts the processed run-length data into bitmap data. However, an image processing process including an alignment process may have previously been performed on the run-length data, the previously-processed run-length data may be supplied to the exposure recording apparatus 10, and then the decoder 78 may perform a decompressing process on the run-length data and the transposition processor 82 may perform a transposition.

FIG. 10 shows a block diagram of a control circuit of the exposure recording apparatus 10 according to another embodiment of the present invention. The constituent elements that are identical to those of the control circuit shown in FIG. 7 are labeled with the same reference numeral, and description thereof will be omitted.

In this embodiment, an I/F 86 of an exposure recording apparatus 10 is supplied with run-length data as second compressed data. That is, the mirror sequential data generated by the RIP 8 are first-compressed into run-length data and are aligned. After that, the run-length data are second-compressed, and then the run-length data are supplied as the second-compressed data. For example, the run-length data may be compressed into the second-compressed data by the method of Huffman encoding, Lempel-Ziv encoding or the like.

As described above, since the mirror sequential data that have been compressed twice are supplied to the exposure recording apparatus 10, it is possible to considerably reduce data amount and shorten data transfer time. It is also possible to reduce the amount of memory for storing data in the exposure recording apparatus 10.

The second-compressed data that have been supplied to the I/F 86 are temporarily stored into an input buffer 90 by a buffer controller 88. The buffer controller 88 reads the second-compressed data from the input buffer 90, and supplies the second-compressed data to a first decoder 92. The first decoder 92 decompresses the second-compressed data into the run-length data. The run-length data are supplied to a second decoder 94, and then are further decompressed into the mirror sequential data. Incidentally, the first decoder 92 may be arranged at a preceding stage of the buffer controller 88. The run-length data that the first decoder 92 has decompressed the second-compressed data into may be temporarily stored into the input buffer 90. Thereafter, the second decoder 94 may decompress the run-length data into the mirror sequential data.

The mirror sequential data are temporarily stored into an intermediate buffer 98 by the buffer controller 96. Thereafter, the buffer controller 96 reads the mirror sequential data and supplies the data to the transposition processor 82. The transposition processor 82 performs a transposition process to generate the frame sequential data. As in the case of the intermediate buffer 80 shown in FIG. 9, the transposition processor 82 is supplied with blocks, each having a predetermined packet size, of the mirror sequential data from the intermediate buffer 98. Therefore, the transposition processor 82 can convert efficiently blocks of the mirror sequential data into the frame sequential data.

The generated frame sequential data are temporarily stored into an output buffer 102 by a buffer controller 100. The buffer controller 100 reads the frame sequential data and supplies the data to the DMD controller 42. Based on the frame sequential data for each frame supplied from the buffer controller 100, the DMD controller 42 controls the DMD 36 to record a desired image on the substrate F by way of exposure.

Each of the input buffer 90, the intermediate buffer 98 and the output buffer 102 is in the form of a toggle buffer. The buffer controllers 88, 96 and 100 performs data input and output operation efficiently.

The exposure recording apparatus 10 may appropriately be used to expose a dry film resist (DFR) in a process of manufacturing a multilayer printed wiring board (PWB), to form a color filter in a process of manufacturing a liquid crystal display (LCD), to expose a DFR in a process of manufacturing a TFT, and to expose a DFR in a process of manufacturing a plasma display panel (PDP), etc., for example. The present invention is also applicable to an image recording apparatus having ink jet recording heads.

Although a certain preferred embodiment of the present invention has been shown and described in detail, it should be understood that various changes and modifications may be made therein without departing from the scope of the appended claims.

The invention claimed is:

1. An image recording processing circuit for use in an image recording apparatus for recording a two-dimensional image on an image recording surface, the image recording apparatus comprising an image recording head having a plurality of image recording components for forming, on the image recording surface, a chronological sequence of image recording dot groups comprising a plurality of image recording dots based on a plurality of image recording dot data, depending on relative movement of the image recording head with respect to the image recording surface, said image recording processing circuit comprising:

an image recording component sequential data storage circuit for storing the image recording dot data as image recording component sequential data which are chronological data for the respective image recording components;

a converting circuit for converting said image recording component sequential data into frame sequential data which are chronological data for the respective image recording dot groups to be formed by said image recording head; and a frame sequential data storage circuit for storing said frame sequential data adapted to be supplied in a chronological sequence to said' image recording components.

2. An image recording processing circuit according to claim 1, wherein said converting circuit transposes the chronological data for the respective image recording components into the chronological data for the respective image recording dot groups.

3. An image recording processing circuit according to claim 1, wherein said converting circuit reads blocks of said image recording component sequential data for a predetermined number of said image recording components which serve as a portion of said image recording head, and converts the blocks of said image recording component sequential data into said frame sequential data.

4. An image recording processing circuit according to claim 1, further comprising:

a data decompression circuit for decompressing said image recording component sequential data that have been compressed, wherein said image recording component sequential data storage circuit stores said image recording component sequential data that have been decompressed.

5. An image recording apparatus for moving an image recording head relatively to an image recording surface, the image recording head each having a plurality of image recording components for forming, on the image recording surface, an image recording dot group comprising a plurality of image recording dots, and successively supplying the image recording components with a plurality of image recording dot data for forming the image recording dot group depending on the relative movement of the image recording head to form a chronological sequence of image recording dot groups for thereby recording a two-dimensional image on the image recording surface, said image recording apparatus comprising:

an image recording component sequential data storage circuit for storing the image recording dot data supplied to the image recording components as image recording component sequential data which are chronological data for the respective image recording components;

a converting circuit for converting said image recording component sequential data into frame sequential data which are chronological data for the respective image recording dot groups formed by said image recording head;

a frame sequential data storage circuit for storing said frame sequential data; and an image recording component control circuit for controlling said image recording components based on said frame sequential data.

6. An image recording apparatus according to claim 5, wherein said converting circuit transposes the chronological data for the respective image recording components into the chronological data for the respective image recording dot groups.

7. An image recording apparatus according to claim 5, wherein said converting circuit reads blocks of said image recording component sequential data for a predetermined number of said image recording components which serve as a portion of said image recording head, and converts the blocks of said image recording component sequential data into said frame sequential data.

8. An image recording apparatus according to claim 5, wherein said image recording components comprise exposure components for modulating a light beam depending on said image recording dot data, and recording a two-dimensional image on said image recording surface with the modulated light beam.

9. An image recording apparatus according to claim 8, wherein said exposure components make up a micromirror device comprising a two-dimensional array of micromirrors having respective reflecting surfaces for reflecting said light beam, said reflecting surfaces being angularly variable according to said image recording dot data.

10. A method of recording an image by moving an image recording head relatively to an image recording surface, the image recording head each having a plurality of image recording components for forming, on the image recording surface, an image recording dot group comprising a plurality of image recording dots, and successively supplying the image recording components with a plurality of image recording dot data for forming the image recording dot group depending on the relative movement of the image recording head to form a chronological sequence of image recording dot groups for thereby recording a two-dimensional image on the image recording surface, said method comprising the steps of:

supplying the image recording dot data supplied to the image recording components as image recording component sequential data which are chronological data for the respective image recording components;

converting said image recording component sequential data into frame sequential data which are chronological data for the respective image recording dot groups formed by said image recording head;

supplying said frame sequential data in a chronological sequence to said image recording components; and controlling said image recording components based on said frame sequential data to record a two-dimensional image on said image recording surface.

11. An image recording processing circuit for use in an image recording apparatus for moving an image recording head relatively to an image recording surface, the image recording head each having a plurality of image recording components for forming, on the image recording surface, an image recording dot group comprising a plurality of image recording dots, and successively supplying the image recording components with a plurality of image recording dot data for forming the image recording dot group depending on the relative movement of the image recording head to form a chronological sequence of image recording dot groups for thereby recording a two-dimensional image on the image recording surface, said image recording processing circuit comprising:

an image recording component sequential data storage circuit for storing the image recording dot data supplied to the image recording components as image recording component sequential data which are chronological data for the respective image recording components; and a converting circuit for reading blocks of said image recording component sequential data for a predetermined number of said image recording components which serve as a portion of said image recording head, from said image recording component sequential data storage circuit, and converting the blocks of said image recording component sequential data into frame sequential data which are chronological data for the respective image recording dot groups formed by said image recording head;

wherein said frame sequential data are supplied in a chronological sequence to said image recording components.

12. An image recording processing circuit according to claim 11, wherein said image recording component sequential data storage circuit has a plurality of storage areas for storing said image recording component sequential data read in blocks, as data divided for the respective image recording components, and said converting circuit reads said image recording component sequential data simultaneously from said storage areas.

13. An image recording processing circuit according to claim 11, wherein said converting circuit transposes said blocks of said image recording component sequential data into said frame sequential data.

14. An image recording processing circuit according to claim 11, further comprising:
a data decompression circuit for decompressing said image recording component sequential data that have been compressed,
wherein said image recording component sequential data storage circuit stores said image recording component sequential data that have been decompressed.

15. An image recording apparatus for moving an image recording head relatively to an image recording surface, the image recording head each having a plurality of image recording components for forming, on the image recording surface, an image recording dot group comprising a plurality of image recording dots, and successively supplying the image recording components with a plurality of image recording dot data for forming the image recording dot group depending on the relative movement of the image recording head to form a chronological sequence of image recording dot groups for thereby recording a two-dimensional image on the image recording surface, said image recording apparatus comprising:
an image recording component sequential data storage circuit for storing the image recording dot data supplied to the image recording components as image recording component sequential data which are chronological data for the respective image recording components;
a converting circuit for reading blocks of said image recording component sequential data for a predetermined number of said image recording components which serve as a portion of said image recording head, from said image recording component sequential data storage circuit, and converting the blocks of said image recording component sequential data into frame sequential data which are chronological data for the respective image recording dot groups formed by said image recording head; and
an image recording component control circuit for controlling said image recording components based on said frame sequential data.

16. An image recording apparatus according to claim 15, wherein said image recording component sequential data storage circuit has a plurality of storage areas for storing said image recording component sequential data read in blocks, as data divided for the respective image recording components, and said converting circuit reads said image recording component sequential data simultaneously from said storage areas.

17. An image recording apparatus according to claim 15, wherein said converting circuit transposes said blocks of said image recording component sequential data into said frame sequential data.

18. An image recording apparatus according to claim 15, wherein said image recording components comprise exposure components for modulating a light beam depending on said image recording dot data, and recording a two-dimensional image on said image recording surface with the modulated light beam.

19. An image recording apparatus according to claim 18, wherein said exposure components make up a micromirror device comprising a two-dimensional array of micromirrors having respective reflecting surfaces for reflecting said light beam, said reflecting surfaces being angularly variable according to said image recording dot data.

20. A method of recording an image by moving an image recording head relatively to an image recording surface, the image recording head each having a plurality of image recording components for forming, on the image recording surface, an image recording dot group comprising a plurality of image recording dots, and successively supplying the image recording components with a plurality of image recording dot data for forming the image recording dot group depending on the relative movement of the image recording head to form a chronological sequence of image recording dot groups for thereby recording a two-dimensional image on the image recording surface, said method comprising the steps of:
supplying the image recording dot data supplied to the image recording components as image recording component sequential data which are chronological data for the respective image recording components;
reading blocks of said image recording component sequential data for a predetermined number of said image recording components which serve as a portion of said image recording head, and converting the blocks of said image recording component sequential data into frame sequential data which are chronological data for the respective image recording dot groups formed by said image recording head;
supplying said frame sequential data in a chronological sequence to said image recording components; and
controlling said image recording components based on said frame sequential data to record a two-dimensional image on said image recording surface.

* * * * *